United States Patent [19]

Azuma et al.

[11] Patent Number: 4,496,627
[45] Date of Patent: Jan. 29, 1985

[54] ELECTRICAL CONDUCTIVE FOAM BEADS AND MOLDED ELECTRICAL CONDUCTIVE FOAMED ARTICLES OBTAINED THEREFROM

[75] Inventors: Tadashi Azuma; Yoshihiro Akamatsu, both of Tokyo; Hiroyuki Akiyama, Hiratsuka; Shohei Yoshimura, Tomioka, all of Japan

[73] Assignees: Fujimori Kogyo Co., Ltd.; Japan Styrene Paper Corporation, both of Tokyo, Japan

[21] Appl. No.: 444,191

[22] Filed: Nov. 24, 1982

[30] Foreign Application Priority Data

Nov. 25, 1981 [JP] Japan .................................. 56-187864
Nov. 30, 1981 [JP] Japan .................................. 56-191930
Jan. 6, 1982 [JP] Japan ...................................... 57-747

[51] Int. Cl.³ .......................... B32B 15/02; B32B 3/06
[52] U.S. Cl. ................................... 428/336; 428/308.4; 428/307.7; 428/319.1; 428/407; 428/403; 428/926; 428/938; 427/124; 427/105; 427/251; 427/122; 427/222; 427/296
[58] Field of Search ............... 428/308.4, 307.7, 319.1, 428/403, 407, 336; 427/124, 251, 105

[56] References Cited

U.S. PATENT DOCUMENTS

| 4,137,361 | 1/1979 | Deffeyes et al. | 428/403 |
| 4,191,803 | 3/1980 | Katuh | 428/407 |
| 4,195,114 | 3/1980 | Crosby et al. | 428/407 |
| 4,347,165 | 8/1982 | Matheson | 428/403 |

FOREIGN PATENT DOCUMENTS 1357346 6/1974 United Kingdom ............. 428/308.4

Primary Examiner—Patricia C. Ives
Attorney, Agent, or Firm—Birch, Stewart, Kolasch & Birch

[57] ABSTRACT

This invention provides an electrical conductive foam bead comprising a foamed bead core of a thermoplastic synthetic resin at least partially covered on the surface thereof with an electrical conductive layer, and a molded electrical conductive foamed article comprising a plurality of particulate bodies formed by mutually fusing such electrical conductive foam beads, the electrical conductive layers extending over all or a portion of the interface of the mutually fused particulate bodies. The conductive foam beads and molded conductive foamed articles both have improved antistatic effect and are used as packaging and cushioning materials, electromagnetic radiation shields, and the like.

20 Claims, 10 Drawing Figures

ELECTRICAL CONDUCTIVE FOAM BEADS AND MOLDED ELECTRICAL CONDUCTIVE FOAMED ARTICLES OBTAINED THEREFROM

BACKGROUND OF THE INVENTION

This invention relates to electrical conductive foam beads and molded electrical conductive foamed articles obtained therefrom. More particularly, this invention relates to electrical conductive foam beads of a synthetic resin and molded articles obtained therefrom both having an electrical conductive surface and adapted for use in various applications as electrical conductive cushioning materials, electro-magnetic radiation shields and the like with the advantage of preventing electric injury due to electrostatic discharges.

In the industrial packaging field, foamed plastics such as foamed polystyrene, foamed polyethylene, and foamed polypropylene have been widely used as packaging materials for transportation of a variety of products. Although such foamed plastics are preferred in view of light weight, cushioning properties, and low cost, they undesirably tend to accumulate electrostatic charges in the process of packaging and transportation. On the other hand, household electric appliances such as audio components, video tape decks and microwave ovens, various measuring instruments, medical instruments and other electric products have generally improved their performance by incorporating semiconductor integrated circuits therein. Inconveniently, integrated circuits are liable to failure due to electrostatic charges. When the above-mentioned products are packaged in foamed plastics for transportation, there is the likelihood of electrostatic failure of such products, more specifically electrostatic failure of built-in IC's.

In view of the problem that electrostatic charge causes failure or injury of integrated circuits during storage or upon transportation of integrated circuits and finished products having the same built therein, antistatic or electrical conductive plastics have been developed in order to protect integrated circuits from electrostatic failure. Carbon-containing plastics are generally known as a typical conductive plastics. Particularly, examples of conductive plastics having cushioning properties include (1) rigid or flexible foamed polyurethane having carbon blended therein, (2) rigid or flexible foamed polyurethane impregnated with carbon, (3) foamed polyethylene and polystyrene sheets having a carbon-blended plastic film adhered to or a carbon-containing paint coated on the surface thereof, and the like.

These foamed plastics having carbon blended or impregnated have, however, the problem that carbon particles are not always continuous to each other, resulting in a relatively high resistivity. A problem also arises from partially conductive packaging materials in the form of foamed sheets having a conductive film adhered to either surface or a carbon-containing coating applied to either surface.

Since the foamed sheet interposed between conductive layers is highly dielectric, no electrical conduction takes place between the opposed conductive layers. The electrical conductivity of such packaging materials is limited to their surface portions so that sufficient antistatic effect is not expected. The opposed conductive layers rather constitute a capacitor, and in some cases, the electric charge accumulated in this capacitor cannot find any leakage path. Among conventional sheets and molded articles of a complicated profile used for the purpose of preventing electrostatic injury of electric products having integrated circuits built therein, none of them are satisfactory in antistatic effect and cost.

SUMMARY OF THE INVENTION

It is, therefore, an object of the present invention to provide an electrical conductive foam bead which is free of electrostatic charge and can be used as such or as a material for forming an electrical conductive molded foamed articles.

It is another object of the present invention to provide a molded electrical conductive foamed article which is molded from the electrical conductive foam beads, is electrical conductive in any direction or section to provide an excellent antistatic effect, has improved physical properties including impact resilience, cushioning properties, and mechanical strength so that it may be used as a cushioning material, electromagnetic radiation shield or the like for packaging integrated circuit built-in products with a minimized danger of causing mechanical and electrostatic failure or injury to such products.

According to a first aspect of the present invention, there is provided an electrical conductive foam bead comprising a foamed bead core of a thermoplastic synthetic resin and an electrical conductive layer at least partially covering the surface of the core.

According to a second aspect of the present invention, there is provided a molded electrical conductive foamed article which comprises a plurality of particulate bodies in the form of mutually fused electrical conductive beads each consisting of a foamed bead core of a thermoplastic synthetic resin covered at least partially over the surface thereof with an electrical conductive layer, the electrical conductive layers extending over all or a portion of the interface between the mutually fused particulate bodies.

The conductive foam beads of the present invention as such may be used as a filling or cushioning material. For example, a space between a package and a product to be packaged may be directly filled with the conductive foam beads serving as a cushioning material. Since the conductive foam beads may be readily introduced into the space between a package and a product without leaving a gap by the virtue of their small size and substantially spherical or ellipsoidal shape, they may advantageously be used as an antistatic cushioning/filling material for packages of various profiles.

When the conductive foam beads are heated in a mold, preferably in a mold having a capability of enclosing the beads, but allowing escape of gases therefrom, the beads are fused to each other to form an electrical conductive molded foamed articles of a given shape. In this case, the spherical or ellipsoidal shape of the conductive foam beads is very convenient to carry out molding. Since the resultant conductive molded foamed articles is a collection of beads having a conductive surface, it is electrically conductive both in the interior and on the surface along the fused surfaces and free surfaces of the beads. The conductive molded foamed article is thus free of local electrostatic charge.

Since the conductive foam bead of the present invention comprises a foamed bead core covered over the surface with a conductive substance, the amount of the conductive substance adhered and the cost of manufacture are considerably reduced as compared with a conductive bead having a conductive substance compounded throughout the bead. More specifically, when a conductive substance is compounded throughout a bead, the conductive substance is spaced apart upon foaming so that the electrical connection between conductive substance is broken. Such a foamed bead is too high in resistivity to use in practice unless an extremely large amount of the conductive substance is compounded. On the other hand, the conductive foamed bead according to the present invention has a conductive layer only on the surface, and a conductive substance may be used in a relatively small amount to form a relatively thick conductive surface layer, resulting in a relatively low resistivity. Accordingly, conductive foamed articles molded from conductive foam beads according to the present invention have an outstandingly improved antistatic effect and are best suited as a packaging/cushioning material for products to be protected from electrostatic damage. The molded articles may also be used in a variety of applications as electromagnetic radiation shields and the like.

Conductive foamed articles molded from conductive foam beads according to the present invention generally have a surface resistivity ranging from about $10^2$-ohm-cm to about $10^5$ ohm-cm. This resistivity range is well within the range of from $10^3$ ohm-cm to $10^5$ ohm-cm which is generally believed necessary to prevent electrostatic charging.

BRIEF DESCRIPTION OF THE DRAWINGS

The above and other objects, features, and advantages of the present invention will be more fully understood from the following description taken in conjunction with the accompanying drawings, in which.

DESCRIPTION OF THE PREFERRED EMBODIMENT

Figure 1:
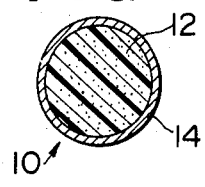
FIG. 1 is a cross-sectional view of one embodiment of the electrical conductive foam bead according to the present invention.
Figure 2:
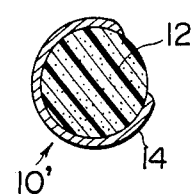
FIG. 2 is a cross-sectional view of another embodiment of the electrical conductive foam bead according to the present invention.

The electrical conductive foam bead according to the present invention is characterized in that a foamed bead core of a theromplastic synthetic resin is covered at least partially over the surface thereof with an electrical conductive layer. FIGS. 1 and 2 show different embodiments of the conductive foam bead. A conductive foam bead generally depicted at 10 in FIG. 1 includes a foamed bead core 12 covered over the entire surface with a conductive layer 14. Another conductive foam bead generally depicted at 10' in FIG. 2 includes a foamed bead core 12 covered over a portion of the surface with a conductive layer 14.

In the second embodiment wherein the foamed bead core 12 is partially covered with the conductive layer 14 as shown in FIG. 2, the conductive layer 14 may preferably cover at least one-third, more preferably at least one-half of the entire surface area of the foamed bead core 12 in order to impart sufficient antistatic effect to the bead itself and to the articles molded from such beads.

From standpoints of antistatic effect and molding, the foamed bead cores 12 may preferably have an averange diameter of 0.5 mm to 8 mm, more preferably 1 mm to 6 mm, and the conductive layer 14 may preferably have a thickness of 1 $\mu$m to 5 $\mu$m, more preferably 2 $\mu$m to 3 $\mu$m.

The thermoplastic resins of which the foamed bead core 12 is made include polyethylene, ethylene-vinyl acetate copolymers, polypropylene, ethylene-propylene copolymers, polystyrene, polyvinyl chloride, and the like. Among these, polyolefin resins are preferred, and polypropylene resins are most preferred. Polypropylene resins may generally be expanded or foamed at an apparent expansion ratio of 10 to 50 times, with an apparent expansion ratio of about 30 times being particularly preferred.

The conductive substances of which the conductive layer 14 is made preferably include graphite, carbon black, aluminum, copper, nickel, tin oxide, chromium oxide, nickel oxide and the like. The use of carbon black as the conductive material has another advantage of improving the weathering resistance of the core-forming resin.

The conductive foam beads may be spherical or ellipsoidal in shape.

The conductive foam beads according to the present invention may be prepared by a variety of methods, for example, by first forming foamed bead cores, and applying a conductive layer to all or a portion of the surface of each foamed bead core, or first forming solid pellets of a thermoplastic resin, applying a conductive layer to all or a portion of the surface of each pellet, and then expanding the conductive layer-bearing pellets.

The former method, that is, forming foamed bead cores followed by application of a conductive layer to the surface thereof is first described. Foamed bead cores may be prepared by any of well-known processes, for example, by blending a thermoplastic synthetic resin with any of well-known foaming agents, forming the resin into expandable pellets in a well-known manner, and expanding the pellets, or by impregnating a foaming agent into the pellets of a thermoplastic synthetic resin, and expanding the pellets to foam. Preferred examples of the foaming agents used for this purpose include low-boiling point organic compounds, particularly, lower hydrocarbons such as propane, butane, pentane, etc., and halogenated hydrocarbons such as dichlorodifluoromethane. The foamed bead cores may preferably have an apparent expansion ratio of about 5 to 50 times, especially about 7 to 35 times. The apparent expansion ratio is determined by the formula : $1000 \times \rho /W$ wherein W is the weight (gram) of foamed bead cores with which a beaker having a volume of 1000 cc is filled, and $\rho$ is the density (gram/cm$^3$) of a resin of which the foamed bead cores are made.

Foaming may be carried out by any suitable method. The foamed bead cores may be prepared, for example, by dispersing pellets of a thermoplastic resin containing a volatile foaming agent in a suitable dispersion medium under heat in a sealed vessel opening one end of the vessel, and releasing the pellets and the dispersion medium simultaneously into an atmosphere under a lower pressure than in the vessel, thereby foaming the pellets, or by placing pellets of a thermoplastic resin containing a volatile foaming agent in an open vessel, and heating the pellets in the vessel to foam the pellets.

The application of a conductive layer to foamed bead cores may also be carried out by any suitable method, for example, by applying a dispersion of a conductive substance to bead cores followed by drying, or by directly depositing a conductive substance to the surface of bead cores by a vacuum deposition or electroless plating technique.

More specifically, when a dispersion of a conductive substance is applied to the surface of foamed bead cores, the dispersion may have the following composition, for example.

Typical composition of the dispersion

|  | Parts by weight |  |
| --- | --- | --- |
| Carbon Powder (conductive substance) | 20-30 |  |
| High-molecular-weight compound emulsion | 5-15 | (Solid) |
| Polyoxyethylene (dispersant) | 1-2 |  |
| Water | 70-100 |  |

Preferred examples of the high-molecular-weight compound emulsion include acrylate/styrene copolymer emulsions, vinyl acetate emulsions, acrylate/ethylene/vinyl acetate copolymer emulsions, ethylene/vinyl acetate copolymer emulsions, acrylate/vinyl chloride copolymer emulsions, and the like. The conductive substance may be dispersed in the form of powder, short fibers or the like. Preferably, the particles may have an average particle size of 0.01-0.1 $\mu$m, especially 0.02-0.05 $\mu$m, and the short fibers of the conductive substance may have a diameter of 5-50 $\mu$m, especially 5-20 $\mu$m, and a length of 0.05-0.5 mm, especially 0.1-0.3 mm. The dispersant may be polyoxyethylene, for example. Such a dispersion may be applied by mixing, immersion, spraying and other well-known techniques. The dispersion is applied to foamed bead cores in such an amount that when the resulting conductive foam beads are molded into a conductive foamed article of given shape, the article may have a surface resistivity of $10^6$ ohm-cm or less, usually from $10^3$ to $10^6$ ohm-cm. This resistivity range approximately corresponds to 100-300 grams of a dispersion containing the above-mentioned high-molecular-weight compound emulsion applied per kilogram of foamed bead cores having an average particle size of 5 mm and an apparent expansion ratio of 30 times. At this time, the conductive substance is present in an amount of about 0.1 to 5 grams per square meters of the surface of foamed bead cores.

The foamed bead cores having the dispersion applied thereto are post-treated, for example, dried at a temperature below the softening temperature of the resin, resulting in subtantially spherical or ellipsoidal foam beads each consisting of a foamed bead core and conductive layer adhered to the surface thereof according to the present invention.

In depositing a conductive layer onto the surface of foamed bead cores by vacuum deposition, electroless plating or the like, any well-known method may be employed. For example, vacuum deposition may be carried out by evaporating a conductive substance to be deposited in a vacuum of about $10^{-4}$ to $10^{-2}$ Torr, and depositing it onto the surface of foamed bead cores. Electroless plating may be carried out by adhering a catalytic metal to the surface of foamed bead cores (for example, by treating foamed bead cores with an acidic solution of stannous chloride and subsequently with an acidic solution of palladium chloride to form a thin layer of metallic palladium on the surface of the cores) and then treating the catalyzed cores in any of well-known electroless plating baths such as electroless nickel and copper plating baths.

According to the above-mentioned methods of producing conductive foam beads, generally pellets of a thermoplastic synthetic resin containing a foaming agent are foamed by a well-known method, for example, by heating them in a liquid, into foamed bead cores of a substantially spherical or ellipsoidal shape, and the foamed cores are provided over the surface with a conductive layer. In this procedure, the substantially spherical or ellipsoidal shape of a foamed bead core makes it easy to form a conductive layer over the entire surface of the core to a uniform thickness, resulting in conductive foam beads of consistent quality.

When solid pellets of a thermoplastic synthetic resin are provided over the surface with a conductive layer prior to foaming the pellets, the conductive layer containing a conductive substance may be formed by co-extrusion, coating or other well-known techniques.

In the co-extrusion technique, a conductive substance in the form of powder or short fibers is kneaded with a thermoplastic synthetic resin such as polyethylene, polypropylene, and polyvinyl chloride to form a conductive resin, then the conductive resin and a conductive substance-free thermoplastic synthetic resin are co-extruded to form an extrudate having a conductive layer on one surface, preferably also on the opposite surfaces. A sheet may be extruded through a T-die while a rod may be extruded through a nozzle die. The thickness of the conductive layer may preferably be greater than 50 $\mu$m, more preferably range from 70 $\mu$m to 100 $\mu$m although it varies with the type and particle size of the conductive substance and other parameters.

The conductive resin may preferably contain 5% to 40% by weight, more preferably 10% to 30% by weight of the conductive substance.

The coating technique may be selected from the immersion of sheets, rods or pellets of a thermoplastic resin in a dispersion of a powdery or fibrous conductive substance, the spraying of a similar dispersion to similar sheets, rods or pellets, the coating of a similar dispersion using an air knife, vacuum deposition, electroless plating, and the like.

For the above-mentioned immersion, spraying and air-knife coating techniques, a dispersion having the following composition may be used.

|  | Parts by weight |  |
| --- | --- | --- |
| Conductive substance | 20 |  |
| High-molecular-weight compound emulsion | 5-15 | (solid) |
| Dispersant | 1-2 |  |
| Water | 80 |  |

It is to be noted that the high-molecular-weight compound emulsion and dispersant used herein may be the same as described earlier.

The sheet or rod having a conductive layer on at least a portion of the surface thereof as prepared by any of the above-mentioned techniques is then cut into pellets which are conductive at the surface. Cutting may be carried out by any of well-known techniques. For example, sheets may be first longitudinally cut into a plurality of strips with a proper width, and the strips are in turn, transversely cut into pellets of a cubic or rectangular shape. Also, rods may be cut in lengths, obtaining pellets.

The thus obtained conductive pellets are impregnated with a foaming agent consisting of a low-boiling point organic compound and then expanded by heating. There are obtained conductive foam beads of a substantially spherical or ellipsoidal shape each having a conductive layer on the surface of a foamed bead core.

The preferred examples of the low-boiling point organic compounds include lower hydrocarbons such as propane, butane and pentane, and halogenated hydrocarbons such as dichlorodifluoromethane. The resin may preferably contain the low-boiling point organic compound in an amount of about 5% to 30% by weight.

The pellets may be heated by any suitable methods, for example, by dispersing them in hot water to heat them under agitation, or by dispersing them in water together with a foaming agent in a sealed vessel under heat to impregnate a foaming agent into them, heating them up to a proper foaming temperature, and releasing them into an atmosphere through an opening, thereby allowing the pellets to foam. Thus, the conductive foam beads of a substantially spherical or ellipsoidal shape are obrained from the pellets.

The apparent expansion ratio of the conductive pellets may be properly selected by adjusting the amount of the foaming agent impregnated. It is preferred to adjust the apparent expansion ratio to 5–50 times such that the surface resistivity of the conductive foam beads may range from about $10^2$ to $10^5$ ohm-cm.

The thus prepared conductive foam beads may be subjected to a post-treatment such as drying, if necessary.

According to the aforesaid method, the conductive foam bead starts from an extrudate which is covered with a conductive layer at least partially over the surface thereof Such extrudates may be continuously produced in a great volume by means of an extruder. The use of a co-extrusion technique makes it possible to carry out extrusion of an extrudate and application of a conductive layer onto the surface of the extrudate in a single step, resulting in a high yield. It is convenient to arrange a cutting machine such as a cutting knife downstream of the extruder such that a sheet or a rod extruded through the extruder is continuously cut into pellets. The thus produced pellets are then impregnated with a foaming agent and expanded by heating. Upon heating, the pellets expand by nature into a spherical or ellipsoidal shape and the conductive layer is also made uniform on the surface of the expanded pellets to cover the entire surface of the latter. In this manner, the conductive foam beads are easily produced without the need for any special procedure.

The thus obtained conductive foam beads may be used in a variety of applications, for example, as a cushioning material by filling a space between a package and a product with the beads. The conductive foam beads may also be used to form a molded conductive foamed article by placing the beads in a mold, heating the beads to fuse them with each other, which may find packaging and other applications.

Figure 3:
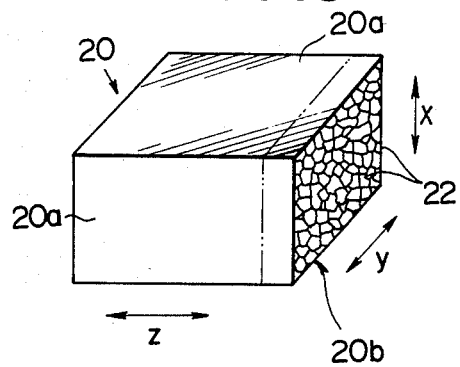
FIG. 3 is a perspective view of the molded electrical conductive foamed articles according to the present invention, with one side cut away.
Figure 4:
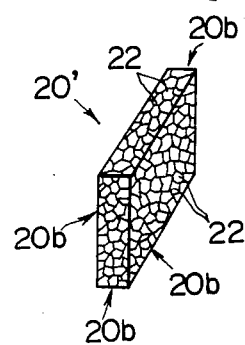
FIG. 4 is a perspective view of a piece cut from the molded foamed article of FIG. 3 with the side surface layers sliced off to expose sections on all the side surfaces.
Figure 5:
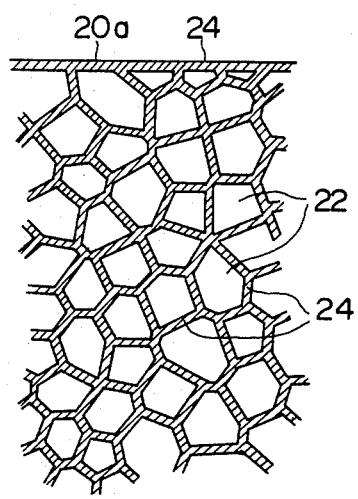
FIG. 5 is an enlarged view of a portion of the cut-away section of the molded article of FIG. 3.

The molded conductive foamed articles will be further described with reference to FIG. 3. A molded conductive foamed article generally depicted at 20 in FIG. 3 may be prepared by feeding conductive foam beads 10 having the conductive layer 14 on the entire surface of the foamed bead core 12 as shown in FIG. 1 in a mold, and heating the beads to fuse. The molded article 20 is composed of a plurality of particulate bodies 22 in the form of mutually fused foam beads. The particulate bodies 22 have a great plurality of cells in the interior although not shown in the drawings. As shown in FIG. 5, a conductive layer 24 which results from the fusion of the conductive layers 14 of the beads 10 extends along the mutually fused interface between particulate bodies 22. It is to be noted that the conductive layer 24 also extends over all the outer surfaces of the molded article 20. Since the conductive layer 24 in the interior of the molded article 20 is formed along the mutually fused interfaces between the particulate bodies 22, it constitutes a continuously structured network, resulting in a three-dimensional reticulate structure. When a side surface layer is sliced off from the molded article 20 to expose a cut surface 20b as shown in FIG. 3, the conductive layer or network 24 is continuous in height direction (x axis), width direction (y axis) and length direction (z axis) in the cut surface 20b. Where the molded article 20 is cut along the dot-and-dash lines in FIG. 3 into a piece, and outer side surfaces 20a are sliced off from this piece to obtain a nude piece 20' having cut surfaces 20b on all the sides as shown in FIG. 4, the conductive layer or network 24 is still continuous in the directions of x, y, and z axes in the cut surfaces 20b of this nude piece 20'. In addition, the conductive layer or network 24 appearing in the outer side surfaces 20a of the molded article 20 is continuous with the conductive layer or network 24 of a three-dimensional reticulate structure in the interior of the article 20 as seen from FIG. 5.

In this manner, not only the molded article 20 is conductive overall by nature, but the piece 20' cut from the molded article is also conductive overall. The molded article 20 always presents a continuously conductive cut surface when it is cut in any of the horizontal, vertical, and oblique directions. The cut pieces and cut surfaces are continuously conductive for the sole reason that the conductive layer 24 is of a three-dimensional reticulate structure in the interior of the molded article.

Figure 6:
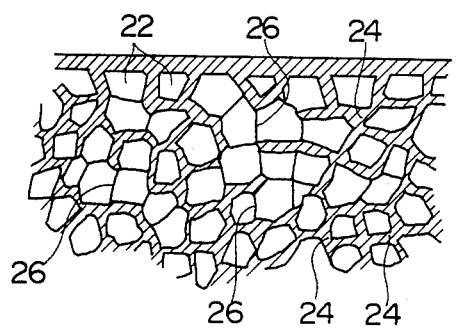
FIG. 6 is an enlarged view, similar to FIG. 5, of a portion of the cut-away section of another embodiment of the molded conductive foamed article.

It will be understood that the molded conductive foamed article of the present invention is not limited to that part shown in FIG. 5 as having the conductive layer along all the mutually fused interfaces of the particulate bodies, but a molded conductive foamed article may partially contain portions 26 where no conductive layer is formed on the mutually fused interface between the particulate bodies as shown in FIG. 6. Such a molded article is produced, for example, by using conductive foam beads 10' having a conductive layer over a portion of the surface of a foamed bead core 12 as shown in FIG. 2, or by using entirely coated beads 10 (shown in FIG. 1) in admixture with partially coated beads 10' or conductive layer-free beads.

Even when conductive layer-free particulate bodies partially coexist in a molded article, or the mutually fused interfaces between particulate bodies partially contain a conductive layer-free portion, a cut surface is sufficiently conductive to achieve the objects of the present invention as long as the conductive layer is continuous somewhere in the cut surface to constitute a three-dimensional reticulate structure.

As described above, the production of a molded conductive foamed article does not necessarily require the use of those conductive foam beads of a thermoplastic resin having a conductive layer over the entire surface thereof. Molded conductive foamed articles may be produced according to the present invention by using those conductive foam beads having a conductive layer covering a portion, generally at least one-third, preferably at least one-half of the entire surface area of the beads. The use of such conductive foamed beads partially coated with a conductive layer is acceptable as long as the resulting molded article has a surface resistivity of $10^6$ ohm-cm or less. Molded conductive foamed articles may also be produced according to the present invention by molding conductive layer-free foam beads of a thermoplastic resin in admixture with the abovementioned conductive foam beads entirely or partially coated with a conductive layer. In this case, care should be taken such that the proportion of the conductive layer-free foam beads does not exceed the limit beyond which the resulting molded article exhibits an undesirably high surface resistivity. In general, the amount of the conductive layer-free foam beads of a thermoplastic resin is less than about two-thirds, preferably less than one-half of the amount of the conductive foam beads. Care should be taken such that the resulting molded article exhibits a surface resistivity of $10^6$ ohm-cm or less.

In the practice of molding of conductive foamed article from conductive foam beads, the conductive foam beads are aged in a pressurized atmosphere of an inorganic gas or a gas mixture of an inorganic gas and a volatile foaming agent to impart an increased internal pressure to the beads, thereafter the aged beads are fed in a mold which can enclose the beads but allow escape of gases therefrom, and the mold is heated to expand the beads. Upon expansion, the beads are mutually fused to form a plurality of particulate bodies 22 as well as forming a conductive layer 24 along the mutually fused interfaces between particulate bodies 22. The source of heat used in molding may preferably be steam, typically steam under a gauge pressure of 0.5 to 5 kg/cm². After the completion of molding, the molded article is cooled to a predetermined temperature. The molded article taken out of the mold is ready for use.

The molded conductive articles according to the present invention may be used as antistatic plastics for protecting semi-fabricated replacement parts such as printed circuit boards having IC's and LSI's built therein, and finished products such as computers, radio sets, television sets, audio equipment, video decks, electronic calculators, watches, cameras, measuring instruments, medical instruments, microwave ovens, and the like from electrostatic damage during storage and transportation. The molded articles may also find their use as electromagnetic radiation shields and heating elements.

In this case, the molded article may be used as such or cut into a plurality of pieces in some applications. Furthermore, side surface layers may be sliced off from a molded article before it is used in other applications.

Figure 7:
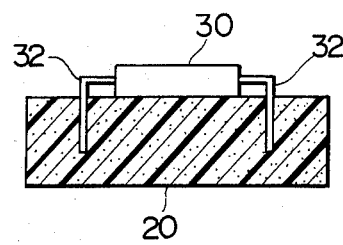
FIGS. 7 to 10 illustrate different applications of the electrical conductive molded foamed article according to the present invention, FIG. 7 being a vertical section, FIGS. 8 and 9 being horizontal sections, and FIG. 10 being a perspective view.
Figure 8:
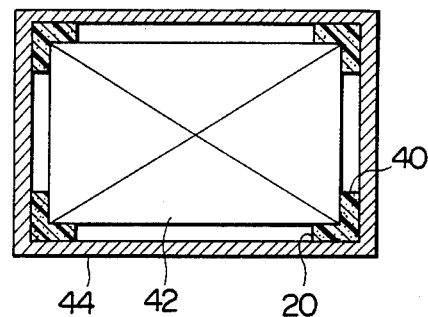
Figure 9:
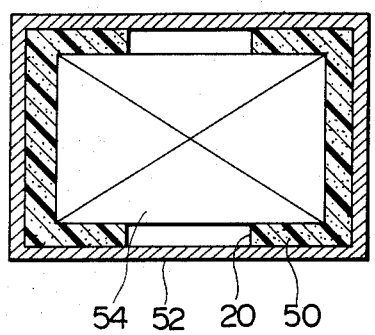
Figure 10:
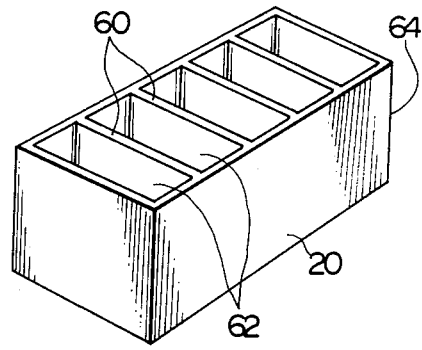

The molded article of the present invention may be used as antistatic plastics in a variety of forms. For example, the molded article may take the form of a flat plate. A product to be protected, for example, a printed circuit board may be placed on such a plate. More specifically, a printed circuit board 30 may be held on the molded article 20 of the present invention in the form of a plate with terminal pins 32 of the circuit board inserted into the plate as shown in FIG. 7. The molded article 20 of the present invention may take the form of a corner pad 40. Then, a product 42 to be protected, for example, a finished product having IC's built therein may be placed in a packaging box 44 with the corner pads 40 interposed between the corners of the product and the box as shown in FIG. 8. The molded article of the present invention may also take the form of a cushioning/packing material 50 as shown in FIG. 9. A product 54 to be protected is placed in a packaging box with the cushioning/packing material 50 covering entirely or partially the product 54. Further, the molded article of the present invention may take the form of a box 64 having a plurality of partitions 60 for defining a plurality of chambers 62 therein. A printed circuit board having IC's built therein may be received in each chamber 62 in contact with the wall. In a further embodiment, partitions 60 prepared by slicing the molded article 20 of the present invention may be set in a box made of paper to define similar chambers in which printed circuit boards are received in contact with the partitions.

In any of the above-mentioned embodiments, a product to be protected, for example, a printed circuit board is protected from electrostatic failure or injury since it is in contact with the molded conductive article of the present invention.

The molded conductive articles of the present invention not only serve for antistatic effect, but also prevent the adhesion or deposition of dust or contaminants, or the exposure of light-sensitive materials to light.

The molded conductive foamed articles of the present invention are improved in electric conduction to provide excellent antistatic effect, and retain the inherent physical properties of the resin including impact resilience, cushioning properties and mechanical strengths. The retention of such physical properties of the resin allows a product to be protected, for example, a printed circuit board to be supported, held and packaged in security with the minimized failure, deformation or distortion of the molded article under loads. Since the conductive substance is not contained throughout the resin of the bead, there is no need for an excess amount of the conductive substance, which results in a corresponding cost reduction. There is no likelihood that the conductive substance will peel off from the surface of the molded article, eliminating the problems that a product to be protected will otherwise be contaminated with an adhering conductive substance and the surface resistivity of the article is changed.

The following examples are illustrative of the present invention, but are not intended as limiting the invention thereto.

EXAMPLE 1

A polypropylene resin was extruded through an extruder into a sheet, which was cut into pellets of 2×2×0.3 mm. The pellets were impregnated with 16 parts by weight of dichlorodifluoromethane as a foaming agent per 100 parts by weight of the pellets, and then heated to a temperature of 150° C. in a glycerine bath. The pellets were expanded at an apparent expansion ratio of 25 times into substantially spherical foamed bead cores having an average diameter of 3.5 mm.

The foamed bead cores were mixed with a dispersion of the following composition, and then dried to form a conductive layer on the surface of the bead cores, obtaining conductive foam beads.

Composition of the dispersion

|  | Parts by weight |
| --- | --- |
| Naturally occurring flake graphite/ acetylene black (1/3) | 20 |
| Acrylate-styrene copolymer emulsion | 8 (solid) |
| Polyoxyethylene (dispersant) | 1 |
| Water | 80 |

The amount of the dispersion adhered was about 200 g per kilogram of the bead cores, which corresponded to 2 gram of the dispersion per square meters of the surface area of the bead cores. The resulting conductive foam beads had a surface resistivity of $1.5 \times 10^4$ ohm-cm.

EXAMPLE 2

A dispersion of the following composition was applied to pellets of polypropylene by an immersion technique in a proportion of 5 grams of the solids per square meters of the surface area of the pellets.

Composition of the dispersion

|  | Parts by weight |
| --- | --- |
| Graphite/carbon black (1/3) | 20 |
| Acrylate-vinyl acetate (7/3) copolymer emulsion | 20 (solid) |
| Dispersant (polyoxyethylene) | 2 |
| Water | 58 |

The conductive pellets were impregnated with dichlorodifluoromethane and expanded at an apparent expansion ratio of 25 times into conductive foam beads having an average diameter of 4.5 mm. The beads had a surface resistivity of $10^6$ ohm-cm.

EXAMPLE 3

Polyethylene and a compound of 35 parts by weight of carbon black and 65 parts by weight of low-density polyethylene were co-extruded into a laminate consisting of a polyethylene sheet having on the opposite surfaces layers of the compound each in an amount of 10 grams/m², the laminate having a total thickness of 250 μm. The laminate was cut into strips which were cut into conductive pellets of $2 \times 2 \times 0.25$ mm. The pellets were impregnated with dichlorodifluoromethane and were expanded by heating at an apparent expansion ratio of 30 times, obtaining conductive foam beads having an average diameter of 3.2 mm. The beads had a surface resistivity of $10^5$ ohm-cm.

EXAMPLE 4

Appropriate amounts of pellets of base resins shown in Table 1, dichlorodifluoromethane (volatile foaming agent), aluminum oxide (dispersant), and water (dispersion medium) were placed in a vessel, which was sealed. While stirring to disperse the pellets in water, the vessel was heated to a predetermined temperature to impregnate the foaming agent into the pellets. While the pressure in the vessel was kept at a predetermined pressure, the vessel was released to the ambient atmosphere through an opening to allow the pellets and water to escape into the ambient atmosphere, obtaining foamed bead cores having the expansion ratio shown in Table 1 after drying.

The foamed bead cores were allowed to stand for 50 hours at room temperature and atmospheric pressure, and then a dispersion of a conductive substance having the composition shown in Table 2 was sprayed to the surface of the cores to adhere the conductive substance thereto in the amounts shown in Table 1. The resulting conductive foam beads were dried. A pressure vessel was charged with the conductive foam beads and pressurized to a gauge pressure of 2 kg/cm² by introducing air. The beads were aged under the pressure at room temperature for 48 hours. Thereafter, the beads were fed in a mold and were expanded by heating with steam under a steam gauge pressure of 4 kg/cm², obtaining a molded article of the same configuration as that of the mold cavity. The resulting molded articles (Example 4, Nos. 1–3) were measured for several physical properties as well as pieces (Example 4, Nos. 4–6) obtained by slicing the molded articles to a given width as shown by dot-and-dash lines in FIG. 3. For the sake of comparison, a molded polyethylene foam article free of the conductive substance and a conventional flexible polyurethane foam containing carbon were also measured for the physical properties. The results are shown in Table 3.

TABLE 1

| Example 4 No. | Foamed bead core | | | Amount of conductive substance adhered (g/m²) |
| --- | --- | --- | --- | --- |
|  | Base resin | Apparent ratio of expansion | Average diameter (mm) |  |
| 1 | polypropylene | 30 | 3.5 | 1.0 |
| 2 | polypropylene | 45 | 4.0 | 1 |
| 3 | polyethylene | 25 | 3.6 | 3 |

TABLE 2

Composition of dispersion

| Ingredient | Example 4 (parts by weight) | | |
| --- | --- | --- | --- |
|  | No. 1 | No. 2 | No. 3 |
| Naturally occurring flake graphite/ acetylene black (1/3) | 5 | 10 | 30 |
| Acrylate/styrene copolymer emulsion | 8* | 8* | 8* |
| Dispersant | 1 | 1 | 1 |
| Water | 80 | 80 | 80 |

*The amount of solid.

TABLE 3

| Example 4 No. | Specimen | Specimen size* (mm) | Apparent expansion ratio | Surface resistivity (ohm-cm) | Compression hardness** (kg/cm²) |
| --- | --- | --- | --- | --- | --- |
| 1 | Article A | 30 × 300 × 300 | 30 | $10^4$–$10^6$ | 1.0 |
| 2 | Article B | " | 45 | " | 0.7 |

TABLE 3-continued

| Example 4 No. | Specimen | Specimen size* (mm) | Apparent expansion ratio | Surface resistivity (ohm-cm) | Compression hardness** (kg/cm$^2$) |
|---|---|---|---|---|---|
| 3 | Article C | " | 25 | " | 0.5 |
| 4 | Slice from article A | 10 × 30 × 300 | 30 | " | 1.0 |
| 5 | Slice from article B | " | 45 | " | 0.7 |
| 6 | Slice from article C | " | 25 | " | 0.5 |
| Comparative Example 1 | Conductive substance-free polyethylene foam | 30 × 300 × 300 | 25 | 10$^{14}$ | 0.5 |
| Comparative Example 2 | Carbon-containing flexible polyurethane foam | | 30 | 10$^4$–10$^6$ | 0.1 |

*thickness × width × length
**JIS K-6767

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrical conductive foam bead comprising a foamed bead core of a thermoplastic synthetic resin and an electrical conductive layer at least partially covering the surface of said foamed bead core.

2. The conductive bead as claimed in claim 1 wherein the thermoplastic synthetic resin is polyethylene, an ethylenevinyl acetate copolymer, polypropylene, an ethylene-propylene copolymer, polystyrene or polyvinyl chloride.

3. The conductive bead as claimed in claim 2, wherein the foamed bead core of a thermoplastic synthetic resin has a spherical or ellipsoidal shape of an average diameter of 0.5 mm to 8 mm and said electrical conductive layer is made of an electrical conductive substance selected from the group consisting of graphite, carbon black, aluminum, copper, nickel, tin oxide, chromium oxide, nickel oxide and mixtures thereof, the foamed bead core having an apparent expansion ratio of 5 to 50 times, the conductive layer having a thickness of 1 μm to 5 μm, and the conductive layer covering at least one-third of the entire surface area of the foamed bead core.

4. The conductive bead as claimed in claim 1 wherein the conductive bead is prepared by applying onto the surface of the foamed bead core a dispersion of an electrical conductive substance essentially based on graphite, carbon black, aluminum, copper, nickel, tin oxide, chromium oxide or nickel oxide to form the electrical conductive layer.

5. The conductive bead as claimed in claim 1 wherein the conductive bead is prepared by vacuum depositing an electrical conductive substance onto the surface of the foamed bead core to form the electrical conductive layer.

6. The conductive bead as claimed in claim 1 wherein the conductive bead is prepared by forming an electrical conductive pellet in the form of a solid core of the thermoplastic synthetic resin having an electrical conductive layer over at least a portion of the surface thereof, impregnating the conductive pellet with a foaming agent consisting of a low-boiling point organic compound, and heating the impregnated pellet for foaming.

7. The conductive bead as claimed in claim 6 wherein the solid core is made of a starting synthetic resin selected from polyethylene, an ethylene-vinyl acetate copolymer, polypropylene, an ethylene-propylene copolymer, polystyrene, and polyvinyl chloride.

8. The conductive bead as claimed in claim 6 wherein the conductive layer comprises an electrical conductive component selected from graphite, carbon black, aluminum, copper, nickel, tin oxide, chromium oxide, and nickel oxide.

9. The conductive bead as claimed in claim 6, wherein the conductive pellet is formed by extruding the electrical conductive layer over the surface of a layer of the thermoplastic synthetic resin by a co-extrusion technique, and cutting the extrudate into pellets.

10. The conductive bead as claimed in claim 6, wherein the conductive pellet is prepared by coating a core of the thermoplastic synthetic resin over at least a portion of the surface thereof with the electrically conductive layer.

11. The conductive bead as claimed in claim 1, wherein the electrical conductive layer covers at least one-third of the entire surface area of the foamed bead core.

12. The conductive bead as claimed in claim 1, wherein the foamed bead core of a thermoplastic synthetic resin has a spherical or ellipsoidal shape of an average diameter of 0.5 mm to 8 mm and said electrical conductive layer is made of an electrical conductive substance selected from the group consisting of graphite, carbon black, aluminum, copper, nickel, tin oxide, chromium oxide, nickel oxide and mixtures thereof, the foamed bead core having an apparent expansion ratio of 5 to 50 times, the conductive layer having a thickness of 1 μm to 5 μm, and the conductive layer covering at least one-third of the entire surface area of the foamed bead core.

13. A molded electrical conductive foamed article comprising a plurality of particulate bodies in the form of mutually fused electrical conductive beads each consisting of a foamed bead core of a thermoplastic synthetic resin covered at least partially over the surface thereof with an electrical conductive layer, and the electrical conductive layers extend over all or a portion of the interface of the mutually fused particulate bodies.

14. A molded electrical conductive foamed article as in claim 13, wherein said thermoplastic synthetic resin is polyethylene, an ethylenevinyl acetate copolymer, polypropylene, an ethylene-propylene copolymer, polystyrene or polyvinyl chloride.

15. A molded electrical conductive foamed article as in claim 13, wherein said electrical conductive layer is comprised of an electrical conductive substance selected from the group consisting of graphite, carbon black, aluminum, copper, nickel, tin oxide, chromium oxide, nickel oxide and mixtures thereof.

16. A molded electrical conductive foamed article as in claim 13, wherein said electrical conductive layer covers at least one-third of the surface area of said foamed bead core.

17. A molded electrical conductive foamed article as in claim 13, wherein said molded article has a surface resistivity of $10^6$ ohm-cm or less.

18. A molded electrical conductive foamed article as in claim 13, wherein said electrical conductive beads comprise a mixture of (a) foamed bead cores being entirely coated on the surface thereof with an electrical conductive layer and (b) foamed bead cores being partially coated on the surface thereof with an electrical conductive layer.

19. An electrical conductive foam bead comprising:
(a) a foamed bead core of a thermoplastic synthetic resin selected from the group consisting of polyethylene, an ethylenevinyl acetate copolymer, propylene, an ethylenepropylene copolymer, polystyrene and polyvinyl chloride; and
(b) an electrical conductive layer comprised of an electrical conductive substance selected from the group consisting of graphite, carbon black, aluminum, copper, nickel, tin oxide, chromium oxide, nickel oxide and mixtures thereof, said conductive layer having a thickness of from about 1 μm to about 5 μm and covering at least one-third of the entire surface area of said foamed bead core.

20. A molded electrical conductive foamed article comprising a plurality of particulate bodies in the form of mutually fused electrical conductive beads, each bead comprising a foamed bead core of a thermoplastic synthetic resin covered at least partially over the surface thereof with an electrical conductive layer, the electrical conductive layers extending over all or a portion of the interface of the mutually fused particulate bodies, said molded article having a surface resistivity of $10^6$ ohm-cm or less, and each of said electrical conductive beads comprising:
(a) a foamed bead core of a thermoplastic synthetic resin selected from the group consisting of polyethylene, an ethylenevinyl acetate copolymer, propylene, an ethylenepropylene copolymer, polystyrene and polyvinyl chloride; and
(b) an electrical conductive layer comprised of an electrical conductive substance selected from the group consisting of graphite, carbon black, aluminum, copper, nickel, tin oxide, chromium oxide, nickel oxide and mixtures thereof, said conductive layer having a thickness of from about 1 μm to about 5 μm and covering at least one-third of the entire surface area of said foamed bead core.

* * * * *